United States Patent [19]

Richards

[11] Patent Number: 5,073,760
[45] Date of Patent: Dec. 17, 1991

[54] D.C. BLOCKING AMPLIFIER

[75] Inventor: Anthony H. Richards, Milton, England

[73] Assignee: U.S. Philips Corp., New York, N.Y.

[21] Appl. No.: 521,770

[22] Filed: May 10, 1990

[30] Foreign Application Priority Data

May 10, 1989 [GB] United Kingdom ............... 8910753

[51] Int. Cl.$^5$ ............................................. H03F 3/45
[52] U.S. Cl. ...................................... 330/252; 455/343
[58] Field of Search .................. 330/124 R, 252, 261, 330/295, 258, 310; 455/341, 343

[56] References Cited

U.S. PATENT DOCUMENTS 4,937,516  6/1990  Sempel ............................ 330/252 X
4,965,528 10/1990  Okanabu ............................ 330/252

Primary Examiner—Steven Mottola
Attorney, Agent, or Firm—Jack D. Slobod

[57] ABSTRACT

A d.c. blocking amplifier circuit which has a fast start-up time and can be d.c. coupled to other similar circuits or cascaded with differential amplifiers comprising first and second differential amplifiers (40,42 and 44,46) and first and second balanced input lines (52,56), the first input line (52) being connected to the first differential amplifier which in operation amplifies an a.c. signal applied by way of the first input line (52), and the second input line (56) being connected to the second differential amplifier (44,46) which in operation amplifies an a.c. signal applied by way of the second input line (56). Outputs of the first and second differential amplifiers (40,42 and 44,46) are combined to produce an amplified signal which is independent of the d.c. conditions on each of the first and second balanced signal input lines. The circuit is suitable for use in digital paging receivers which operate a battery economizing regime.

20 Claims, 4 Drawing Sheets

D.C. BLOCKING AMPLIFIER

BACKGROUND OF THE INVENTION

The circuit is suitable for use in digital paging receivers which operate a battery economising regime.

1. Field of the Invention

The present invention relates to a d.c. blocking amplifier suitable for use as a stage in a limiter having a plurality of such stages. An application of such a d.c. blocking amplifier is in battery powered communications equipment such as digital paging receivers.

2. Description of the Related Art

Limiters, otherwise termed limiting amplifiers, may be used to amplify signals from low levels up to high levels suitable for driving a demodulator. Consequently they require high gains, typically 80 to 100 dB, and normally comprise a cascade of identical low gain stages. If successive low gain stages are cascaded then unless precautions are taken there is a risk of large d.c. offsets being built-up in earlier stages due to amplification which cause the later stages to be continuously hard switched in one direction and hence not amplify.

FIG. 1 of the accompanying drawings is a block schematic diagram illustrating one known technique for overcoming the problem of d.c. offsets. The drawing shows a balanced limiting amplifier comprising five low gain stages 10, 12, 14, 16 and 18 connected in cascade between inputs 19, 20 and outputs 21, 22. Such a limiting amplifier is embodied in integrated circuits Motorola MC 3362, Plessey SL 6637 and Signetics CA 3089. The signal outputs 21, 22 are fedback to respective inputs 19, 20 by respective feedback paths each including a resistor 23, 24. Two relatively large, off-chip capacitors 25, 26 are connected to the feedback paths to remove the amplified signal and thereby prevent it from feeding back to the inputs. This known circuit works satisfactorily in the sense that the d.c. offsets throughout the limiter are typically less than 1 mV. However the need for relatively large, off-chip capacitors has the disadvantages that they are not integratable and that the start-up time which is determined by the charging of the feedback capacitors will be relatively long. Modern digital pagers, such as those operating in accordance with the CCIR Radiopaging Code No. 1, normally incorporate battery economising techniques in which at least a part of the receiver is energised and de-energised in rapid succession. The time constant due to the charging of such large capacitors is greater than the economiser duty cycle which means that the limiting amplifier has to remain energised.

FIG. 2 of the accompanying drawings is a block schematic diagram illustrating another known technique for overcoming d.c. offset problems with cascaded limiting amplifiers. In this example successive gain stages 28, 30, 32, 34 and 36 are a.c. coupled by on-chip capacitors 29, 31, 33, 35 connected between successive stages. Examples of this type of limiting amplifier are the Sanyo LA 8610 and the Plessey SL 6639. When such limiting amplifiers are used in digital paging receivers, the start-up time is determined by the C-R high frequency roll-in point, typically 2 ms for a 500 Hz cut-in frequency. In the case of the Plessey SL 6639 where the resistance R is in the base circuit and is limited to about 400K ohm, then C has a value of about 800 pF for a 500 Hz high-pass filter.

SUMMARY OF THE INVENTION

An object of the present invention is to avoid the build-up of substantial offsets when interconnecting amplifier stages.

According to one aspect of the present invention there is provided a d.c. blocking amplifier comprising first and second differential amplifiers, first and second balanced signal input lines, the first input line being connected to the first differential amplifier which in operation amplifies an a.c. signal applied by way of the first input line, the second input line being connected to the second differential amplifier which in operation amplifies an a.c. signal applied by way of the second input line, outputs of the first and second differential amplifiers being combined to produce an amplified signal which is independent of the d.c. conditions on each of the first and second balanced signal input lines.

A feature of the d.c. blocking amplifier circuit made in accordance with the present invention is that d.c. offsets between the first and second balanced signal input lines cause no significant change in d.c. levels in the combined outputs of the first and second differential amplifiers. Consequently the circuit is cascadable without the build-up of offset and yet can be d.c. coupled allowing the simpler biasing arrangements of balanced designs.

In one embodiment of the present invention the first and second differential amplifiers comprise first and second and third and fourth active devices, respectively, each said device having a signal input and a signal output. First and second voltage difference applying means are connected between the signal inputs of the first and second active devices and of the third and fourth active devices, respectively. The first signal input line is connected to the signal input of the first active device and the second signal input line is connected to the signal input of the third active device. The values of the first and second voltage difference applying means are equal so that the voltage difference between the first and second active devices is substantially equal and opposite to the voltage difference between the third and fourth active devices. A first output port is connected jointly to the signal outputs of the first and fourth active devices and a second output port is connected jointly to the signal outputs of the second and third active devices. A capacitive element is connected between the signal inputs of the second and fourth active devices.

Another embodiment of a d.c. blocking amplifier in accordance with the present invention comprises first and second differential amplifiers respectively comprising first and second semiconductor active devices and third and fourth semiconductor active devices, output electrodes of the first and fourth active devices being jointly connected to a first output port and output electrodes of the second and third active devices being jointly connected to a second output port, a first signal input being connected to a signal input electrode of the first active device and by way of a first resistive element to a signal input electrode of the second active device, a second signal input being connected to a signal input electrode of the third active device and by way of a second resistive element to a signal input electrode of the fourth active device, and a capacitive element coupled between the signal input electrodes of the second and fourth active devices.

In the embodiments of the present invention a load is connected to each of the first and second output ports.

The first to fourth active devices may each comprise a junction transistor of similar conductivity type, the signal inputs comprising the base electrodes and the signal outputs comprise the collector electrodes.

If desired respective emitter follower circuits may be provided in the signal paths to the base electrodes of the first to fourth transistors. By providing the emitter follower circuits the input impedance of the active devices is increased which reduces the parallel loading of the active devices on the apparent value of the first and second resistive elements. This allows the magnitude of the resistive devices to be further increased and so enables the capacitive element to have a lower value of capacitance which reduces its on-chip area. A current source may be connected in the emitter circuit of each of the emitter follower circuits in order to maintain the frequency response.

According to another aspect of the present invention there is provided a cascaded amplifier arrangement comprising a plurality of differential amplifiers and a plurality of d.c. blocking amplifiers, outputs of each differential amplifier being connected to inputs of a next following d.c. blocking amplifier, wherein each d.c. blocking amplifier comprises first and second differential amplifiers respectively comprising first and second semiconductor active devices and third and fourth semiconductor active devices, output electrodes of the first and fourth active devices being jointly connected to a first output port and output electrodes of the second and third active devices being jointly connected to a second output port, a first signal input being connected to a signal input electrode of the first active device and by way of a first resistive element to a signal input electrode of the second active device, a second signal input being connected to a signal input electrode of the third active device and by way of a second resistive element to a signal input electrode of the fourth active device, and a capacitive element coupled between the signal input electrodes of the second and fourth active devices.

The first, second, third and fourth semiconductor active devices may comprise junction transistors.

According to a further aspect of the present invention there is provided an apparatus comprising a d.c. blocking amplifier in accordance with the one aspect of the present invention or a cascaded amplifier arrangement in accordance with the another aspect of the present invention.

BRIEF DESCRIPTION OF THE DRAWING

The present invention will now be explained and described, by way of example, with reference to the accompanying drawings, wherein.

DETAILED DESCRIPTION OF THE PREFERRED EMBODIMENT

Figure 1:
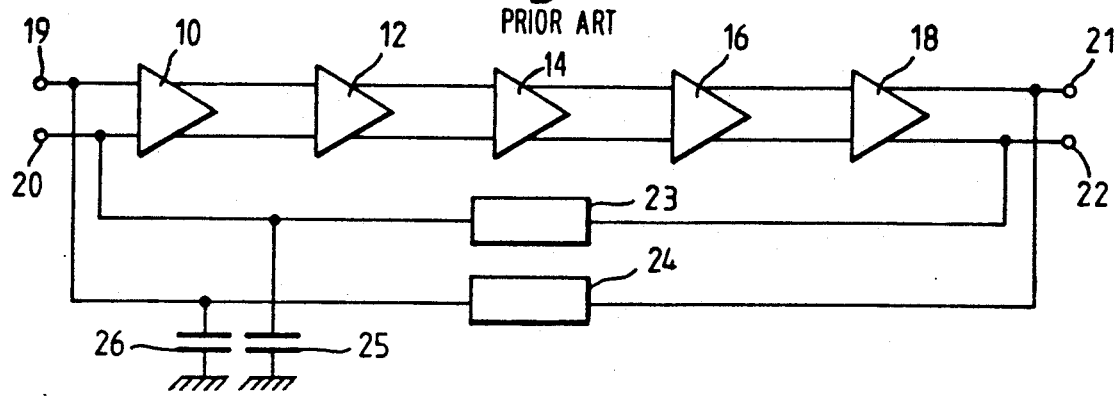
FIGS. 1 and 2 show two known types of cascaded limiting amplifier circuits.
Figure 2:
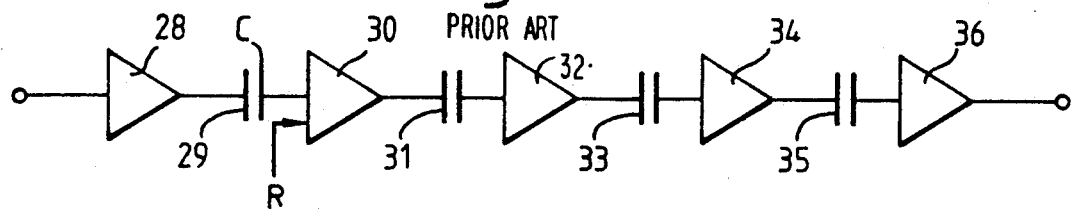

In the drawings the same reference numerals have been used to identify corresponding features. As FIGS. 1 and 2 have been described in the preamble they will not be re-described in this part of the specification.

Figure 3:
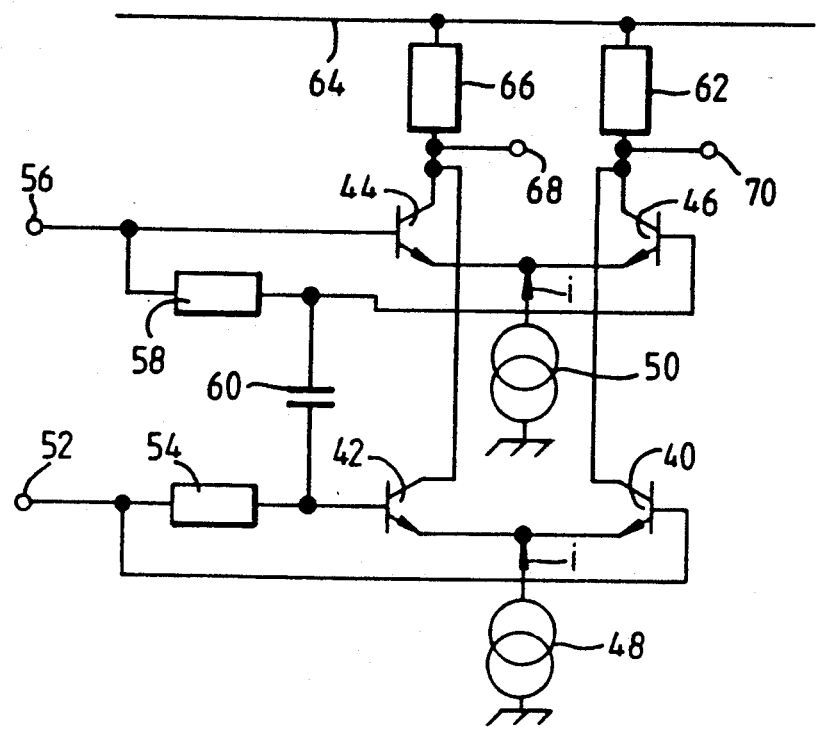
FIG. 3 is a schematic circuit diagram of one embodiment of a d.c. blocking amplifier stage made in accordance with the present invention.

The embodiment of the d.c. blocking amplifier stage shown in FIG. 3 comprises first and second NPN transistors 40, 42 whose emitter electrodes are joined together and connected to a first constant current source 48 and third and fourth NPN transistors 44, 46 whose emitter electrodes are joined together and connected to a second constant current source 50. The current sources 48, 50 are identical. A first signal input 52 is connected to the base electrode of the first transistor 40 and is connected by way of a first resistor 54 to the base electrode of the second transistor 42. A second signal input 56 is connected to the base electrode of the third transistor 44 and is connected by way of a second resistor 58 to the base electrode of the fourth transistor 46. The first and second resistors 54, 58 are of equal value. A capacitor 60 is connected between the base electrodes of the second and fourth transistors 42, 46.

The collector electrodes of the first and fourth transistors 40, 46 are joined together and the junction is connected by way of a load, for example a resistor 62, to a voltage supply line 64. The collector electrodes of the second and third transistors 42, 44 are joined together and the junction is connected by way of another load, for example a resistor 66, to the supply line 64. First and second signal output ports 68, 70 are respectively connected to the junctions in the collector circuits of the transistors 42, 44 and 40, 46, respectively.

The input signals applied to the first and second signal inputs 52, 56 are applied to the base electrodes of the respective pairs of transistors 40, 42 and 44, 46. An imbalance in the emitter currents of either one of the emitter coupled pairs of transistors caused by base current giving a voltage drop across the first or second resistor 54 or 58 is counterbalanced by an equal and opposite contribution from the other of the emitter coupled pairs of transistors. D.C. offsets caused by prior stages that appear between the first and second signal inputs 52, 56 cause no change in d.c. levels at the first and second signal outputs 68, 70. In consequence the illustrated circuit can be d.c. coupled in cascade with other circuits allowing the simpler biasing arrangements of balanced circuit designs.

At frequencies greater than Fc, where $Fc = \frac{1}{\pi 2RC}$, R being the resistance value of each of the resistors 54, 58 in parallel with the input resistance of the active emitter coupled pair and C being the capacitance value of the capacitor 60, the illustrated d.c. blocking amplifier stage has differential gain and common mode rejection. At frequencies less than Fc the d.c. blocking amplifier stage has both differential and common mode rejection. The amplifier stage is balanced and when used in low power applications, the capacitor 60 has no d.c. voltage across it when the circuit is both off and on. This means that the capacitor 60 needs no charging or discharging at switch-on and switch-off. Therefore the time constant for start-up is fast compared to the circuits described with reference to FIGS. 1 and 2 and, being limited only by stray effects, the time constant can be less than 0.1 mS for a 500 Hz roll-in.

Figure 4:
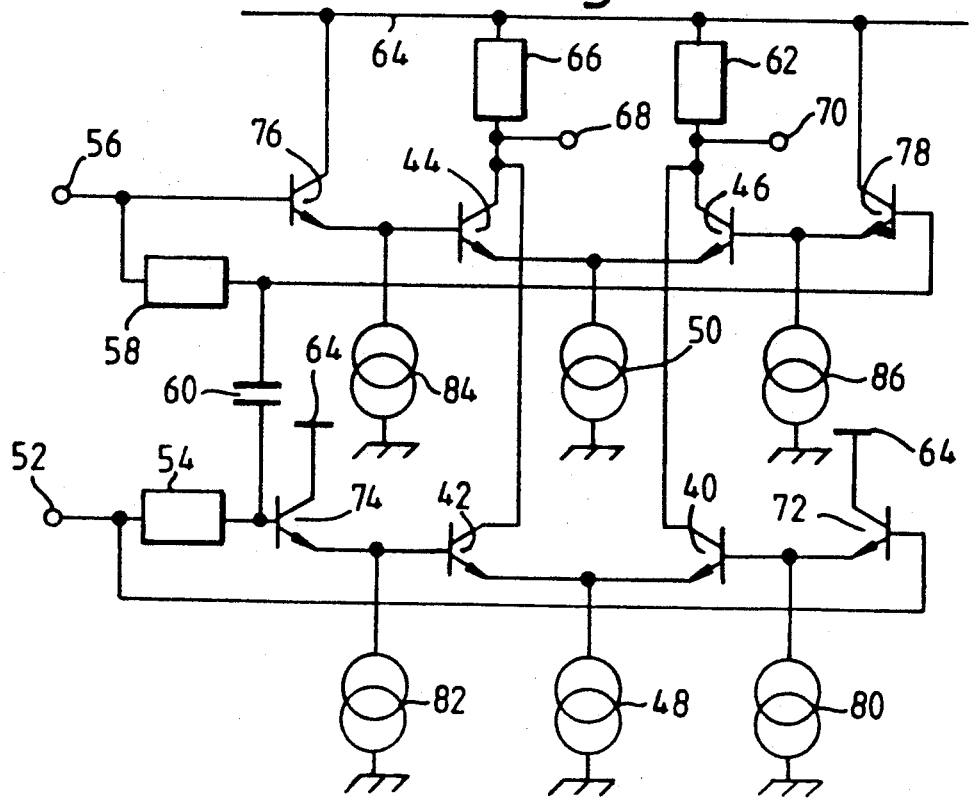
FIG. 4 is a schematic circuit diagram of another embodiment of a d.c. blocking amplifier stage made in accordance with the present invention.

FIG. 4 shows another embodiment of the present invention which is based on the circuit shown in FIG. 3. The differences are the provision of four NPN transistors 72, 74, 76 and 78 connected as emitter followers in the base circuits of the transistors 40, 42, 44 and 46, respectively. A current source 80, 82, 84 and 86 connected to the emitter electrode of the transistors 72, 74, 76 and 78, respectively, enables the emitter followers to maintain the same frequency response as the emitter coupled pair. The provision of the emitter followers increases the input impedance of the active stages. This allows the resistance R to be increased thereby enabling the value of C to be lower than in the FIG. 3 embodiment. The operation of this circuit is similar to that described with reference to FIG. 3.

The balanced design enables a high value of R to be tolerated, greater than 1.5 Mohm, before its d.c. offset causes the stage transconductance to drop significantly. Such a large value of R enables very small, on-chip capacitors, typically less than 100 pF for Fc=500 Hz, to be used allowing the amplifier stage to be integrated into a reduced chip area compared to the known amplifier stages described with reference to FIGS. 1 and 2.

If desired, emitter degeneration resistors (not shown) may be provided in the emitter circuits of the transistors 40, 42, 44 and 46.

Figure 5:
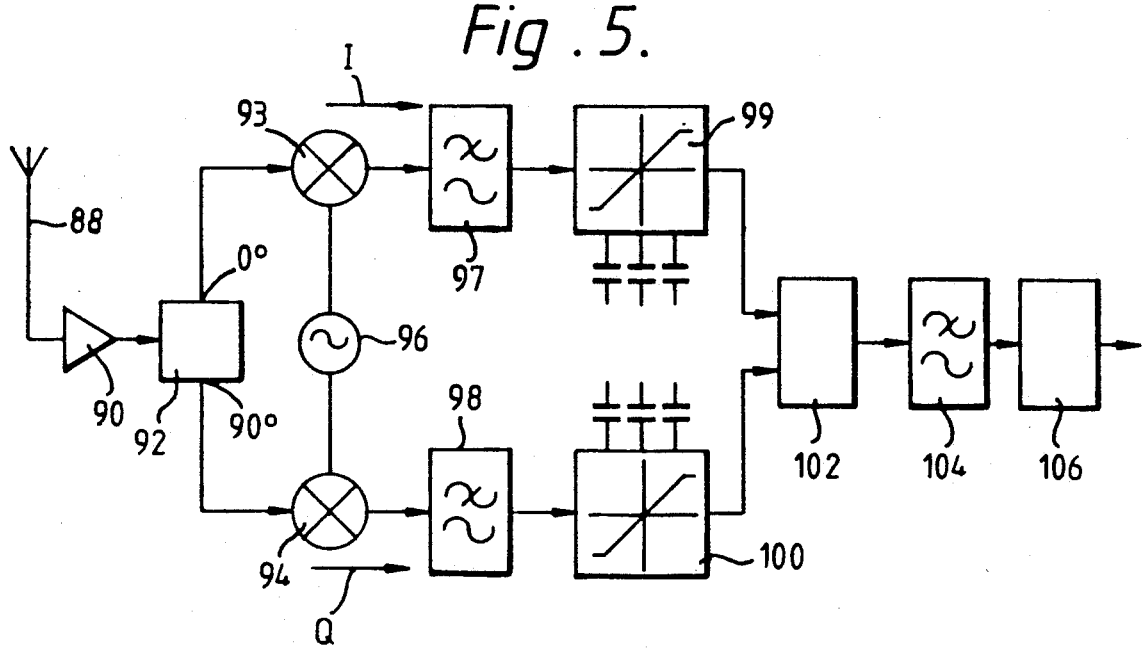
FIG. 5 is a block schematic diagram of a zero IF receiver using a cascaded amplifier made in accordance with the present invention.

The zero IF receiver shown in FIG. 5 comprises an antenna 88 connected to an rf amplifier 90. The output of the r.f. amplifier 90 is connected to a quadrature phase splitter 92 having a 0 degree in-phase output and a 90 degree quadrature phase output. These outputs are connected to respective mixers 93, 94 in I and Q channels. A local oscillator signal is supplied to the mixers 93, 94 by a local oscillator 96, the frequency generated is such as to produce the difference frequency outputs of the mixers 93, 94 at baseband frequencies. Low pass filters 97, 98 select the difference frequency outputs from the other products of mixing and supply them to respective cascaded amplifiers 99, 100. The respective outputs of the cascaded amplifiers 99, 100 are applied to a demodulator 102, which may be of a suitable known design. The output of the demodulator 102 is applied to a data filter 104 and from there to a bit slicer 106.

Figure 6:
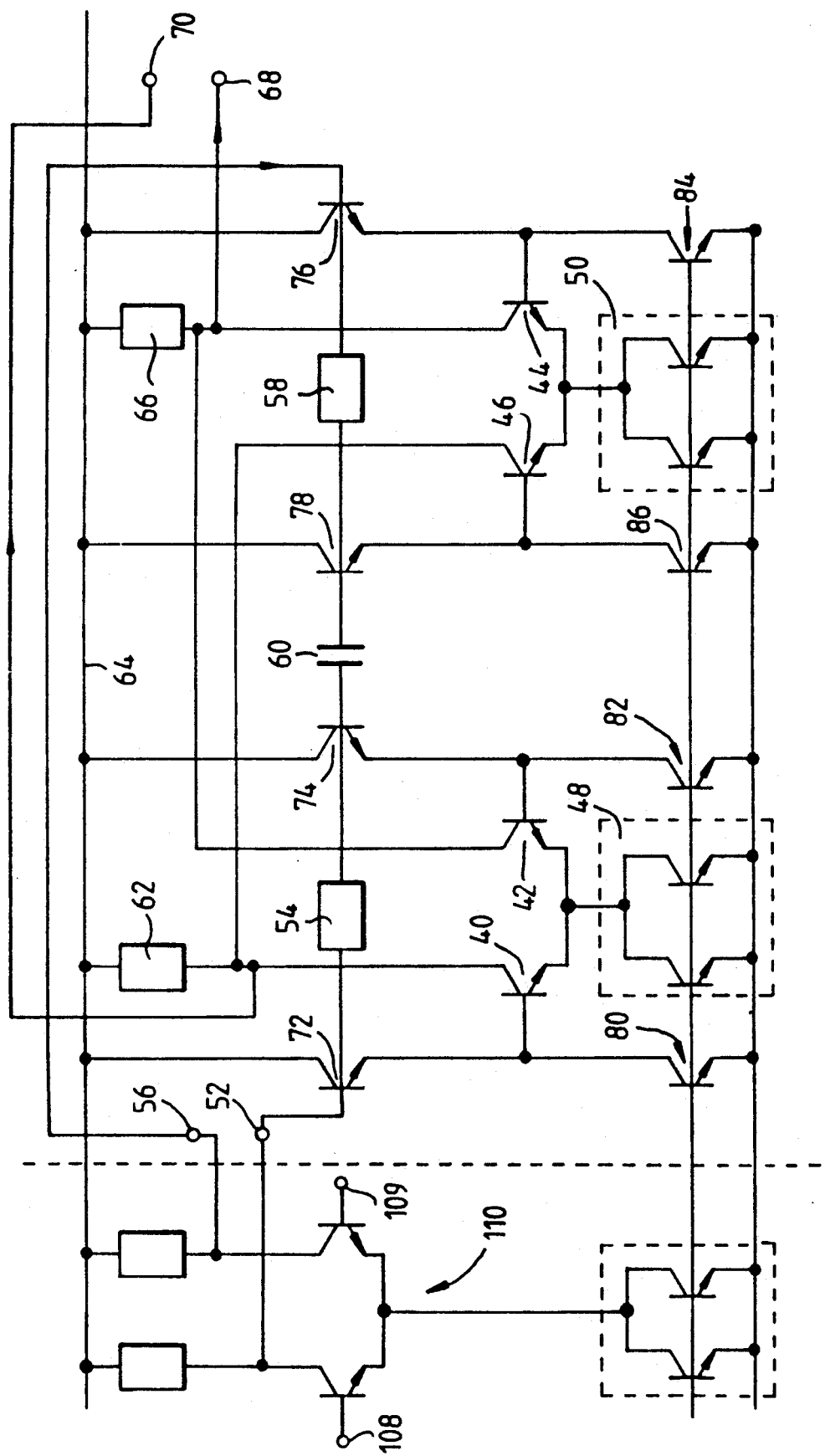
FIG. 6 is a circuit diagram of one stage of a cascaded amplifier arrangement used in the receiver shown in FIG. 5.
Figure 7:
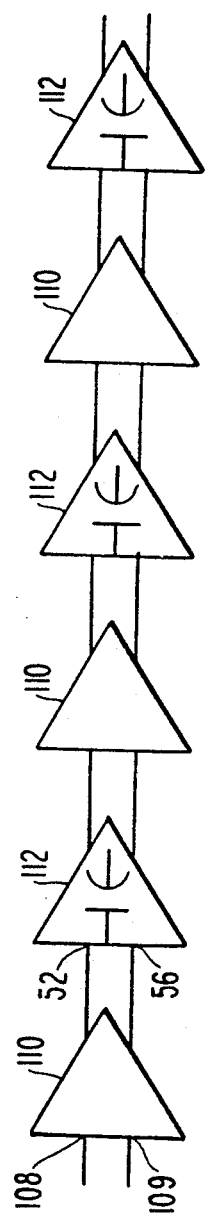
FIG. 7 is a block schematic diagram of a cascaded blocking amplifier arrangement in accordance with this invention.

The cascaded amplifiers 99, 100 comprise a number of cascaded stages comprising alternately arranged differential amplifiers and d.c. blocking amplifier stage as shown FIG. 7. One of such cascaded stages is shown in FIG. 6. An output of the preceding low pass filter 97 or 98 (FIG. 5) or of a preceding cascaded stage is connected to the inputs 108, 109 of a differential amplifier 110. Outputs of the differential amplifier 110 are connected to the inputs 52, 56 of a d.c. blocking amplifier stage 112 of a type generally illustrated in FIG. 4 of the accompanying drawings. As the operation of the circuit is substantially the same as has been described with reference to FIGS. 3 and 4 it will not be repeated.

In the illustrated embodiment in FIG. 6 the loads have been shown as comprising the resistors 62, 66. However other loads may be employed such as a current mirror which would enable a single ended output to be derived using a balanced input.

Although the present invention has been described with reference to a communications apparatus, it may also be applied in other applications requiring an amplifier which prevents the build-up of d.c. offsets or where offsets can be a problem, for example an integrated stereo amplifier for consumer purposes.

From reading the present disclosure, other modifications will be apparent to persons skilled in the art. Such modifications may involve other features which are already known in the design, manufacture and use of limiting amplifiers and components parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A d.c. blocking amplifier comprising first and second differential amplifiers, first and second balanced signal input lines, the first signal input line being d.c. connected only to the first differential amplifier which in operation amplifiers an a.c. signal applied by way of the first signal input line, the second signal input line being d.c. connected only to the second differential amplifier which in operation amplifies an a.c. signal applied by way of the second signal input line, outputs of the first and second differential amplifiers being combined to produce an amplified signal which is independent of the d.c. conditions on each of the first and second balanced signal input lines.

2. A d.c. blocking amplifier comprising:
   a first differential amplifiers including first and second active devices and a second differential amplifier including third and fourth active devices, each of said active devices having a signal input and a signal output;
   a first voltage difference applying means connected between the signal inputs of the first and second active devices and a second voltage difference applying means connected between the signal inputs of the third and fourth active devices, said first and second voltage difference applying means being coupled to first and second balanced signal input lines in a manner that the first balanced signal input line is connected to the signal input of the first active device, the second balanced signal input line is connected to the signal input of the third active device, and a first voltage difference applied between the inputs of the first and second active devices is substantially equal and opposite to a second voltage difference applied between the inputs of the third and fourth active devices; and
   a first output port connected jointly to the signal outputs of the first and fourth active devices and a second output port connected jointly to the signal outputs of the second and third active devices to produce an amplified signal defined between said first and second output ports which is independent of d.c. conditions on each of the first and second balanced signal input lines.

3. A d.c. blocking amplifier as claimed in claim 2, characterised in that a capacitive element is connected between signal inputs of the second and fourth active devices.

4. A d.c. blocking amplifier comprising first and second differential amplifiers respectively comprising first and second semiconductor active devices and third and fourth semiconductor active devices, output electrodes of the first and fourth active devices being jointly connected to a first output port and output electrodes of the second and third active devices being jointly connected to a second output port, a first signal input being connected to a signal input electrode of the first active device and by way of a first resistive element to a signal input electrode of the second active device, a second signal input being connected to a signal input electrode of the third active device and by way of a second resistive element to a signal input electrode of the fourth active device, and a capacitive element coupled between the signal input electrodes of the second and fourth active devices.

5. A d.c. blocking amplifier as claimed in claim 2, characterised in that a load is connected to each of the first and second output ports.

6. A d.c. blocking amplifier as claimed in claim 2, in which the first to fourth active devices each comprise a junction transistor of similar conductivity type, the signal inputs comprise the base electrodes and the signal outputs comprise the collector electrodes.

7. A d.c. blocking amplifier as claimed in claim 6, characterised by respective emitter follower circuits in the signal paths to the base electrodes of the first to fourth transistors.

8. A d.c. blocking amplifier as claimed in claim 7, characterised in that a current source is connected to the emitter electrode of each of the emitter follower circuits.

9. A cascaded d.c. blocking amplifier arrangement comprising a plurality of differential amplifiers and a plurality of d.c. blocking amplifiers, outputs of each differential amplifier being connected to inputs of a next following d.c. blocking amplifier, characterised in that each d.c. blocking amplifier comprises first and second differential amplifiers respectively comprising first and second semiconductor active devices and third and fourth semiconductor active devices, output electrodes of the first and fourth devices being jointly connected to a first output port and output electrodes of the second and third active devices being jointly connected to a second output port, a first signal input being connected to a signal input electrode of the first active device and by way of a first resistive element to a signal input electrode of the second active device, a second signal input being connected to a signal input electrode of the third active device and by way of a second resistive element to a signal input electrode of the fourth active device, and a capacitive element coupled between the signal input electrodes of the second and fourth active devices.

10. An arrangement as claimed in claim 9, characterised in that the first, second, third and fourth semiconductor devices are junction transistors.

11. An arrangement as claimed in claim 10, characterised in that each d.c. blocking amplifier further comprises respective emitter follower circuits in the signal paths to the base electrodes of the first to fourth transistors.

12. An arrangement as claimed in claim 11, characterised in that a current source is connected to the emitter electrode of each of the emitter follower circuits.

13. A d.c. blocking amplifier as claimed in claim 3, characterized in that a load is connected to each of the first and second output ports.

14. A d.c. blocking amplifier as claimed in claim 4, characterized in that a load is connected to each of the first and second output ports.

15. A d.c. blocking amplifier as claimed in claim 2, characterized in that the first to fourth active devices each comprise a junction transistor of similar conductivity type, the signal inputs comprise the base electrodes and the signal outputs comprise the collector electrodes.

16. A d.c. blocking amplifier as claimed in claim 4, characterized in that the first to fourth active devices each comprise a junction transistor of similar conductivity type, the signal inputs comprise the base electrodes and the signal outputs comprise the collector electrodes.

17. A d.c. blocking amplifier as claimed in claim 5, characterized in that the first to fourth active devices each comprise a junction transistor of similar conductivity type, the signal inputs comprise the base electrodes and the signal outputs comprise the collector electrodes.

18. A d.c. blocking amplifier as claimed in claim 16, characterized in that the first to fourth active devices each comprise a junction transistor of similar conductivity type, the signal inputs comprise the base electrodes and the signal outputs comprise the collector electrodes.

19. A d.c. blocking amplifier as claimed in claim 18, characterized by respective emitter follower circuits in the signal paths to the base electrodes of the first to fourth transistors.

20. A d.c. blocking amplifier as claimed in claim 19, characterized in that a current source is connected to the emitter electrode of each of the emitter follower circuits.

* * * * *